United States Patent
Kurihara (10) Patent No.: US 9,780,281 B2
(45) Date of Patent: Oct. 3, 2017

(54) POWER GENERATOR

(71) Applicant: FUJITSU LIMITED, Kawasaki-shi, Kanagawa (JP)

(72) Inventor: Kazuaki Kurihara, Atsugi (JP)

(73) Assignee: FUJITSU LIMITED, Kawasaki (JP)

(*) Notice: Subject to any disclaimer, the term of this patent is extended or adjusted under 35 U.S.C. 154(b) by 763 days.

(21) Appl. No.: 14/322,099

(22) Filed: Jul. 2, 2014

(65) Prior Publication Data

US 2014/0311544 A1 Oct. 23, 2014

Related U.S. Application Data

(63) Continuation of application No. PCT/JP2012/050119, filed on Jan. 5, 2012.

(51) Int. Cl.
*H01L 41/113* (2006.01)
*H01L 41/083* (2006.01)
(Continued)

(52) U.S. Cl.
CPC ............ *H01L 35/32* (2013.01); *H01L 41/083* (2013.01); *H01L 41/113* (2013.01);
(Continued)

(58) Field of Classification Search
CPC .......... H02N 2/18; H02N 2/186; H01L 35/32; H01L 41/083; H01L 41/113; H01L 41/1138; H01L 41/193
(Continued)

(56) References Cited

U.S. PATENT DOCUMENTS

| | | | | |
|---|---|---|---|---|
| 5,188,286 A | * | 2/1993 | Pence, IV | ........ G05D 23/27535 236/1 F |
| 8,674,588 B2 | * | 3/2014 | Kurihara | ................. H01L 35/32 310/306 |
| 2014/0174496 A1 | * | 6/2014 | Park | ...................... H01L 35/325 136/224 |

FOREIGN PATENT DOCUMENTS

| | | |
|---|---|---|
| JP | 2000-012916 | 1/2000 |
| JP | 2001-015823 | 1/2001 |

(Continued)

OTHER PUBLICATIONS

International Search Report, mailed in connection with PCT/JP2012/050119 dated Apr. 10, 2012.

(Continued)

*Primary Examiner* — Thomas Dougherty
(74) *Attorney, Agent, or Firm* — Fujitsu Patent Center (57) ABSTRACT

A power generator includes layered-polymer piezoelectric element that is arranged on an object to be a heat source and a vibration source, and that generates electric power according to vibration transmitted from the object; a first heat conductor containing a flexible material that is arranged on the object, and that conducts heat from the object. The power generator includes a second heat conductor that is arranged on the first heat conductor and the layered-polymer piezoelectric element, and that conducts heat from the first heat conductor. Furthermore, the power generator includes a thermoelectric element that is arranged on the second heat conductor so as to be layered on the second heat conductor on the layered-polymer piezoelectric element, and that generates electric power according to inner temperature difference between temperature on a heat absorbing side obtained by the second heat conductor and temperature on a heat releasing side.

9 Claims, 10 Drawing Sheets

(51) Int. Cl.
  *H02N 2/18* (2006.01)
  *H01L 35/32* (2006.01)
  *H01L 41/193* (2006.01)

(52) U.S. Cl.
  CPC ........ *H01L 41/1138* (2013.01); *H01L 41/193* (2013.01); *H02N 2/18* (2013.01); *H02N 2/186* (2013.01)

(58) Field of Classification Search
  USPC .................. 310/339; 136/205, 207; 322/2 R
  See application file for complete search history.

(56) References Cited

FOREIGN PATENT DOCUMENTS

| | | |
|---|---|---|
| JP | 2003-258330 | 9/2003 |
| JP | 2005-012980 | 1/2005 |
| JP | 2009-240086 | 10/2009 |
| WO | 2011/104772 | 9/2011 |

OTHER PUBLICATIONS

JPOA—Japanese Office Action dated May 12, 2015 for Japanese Patent Application No. 2013-552371, with partial English translation.

\* cited by examiner

THICKNESS OF FIRST HEAT CONDUCTOR [mm]

POWER GENERATOR

CROSS-REFERENCE TO RELATED APPLICATION

This application is a continuation of International Application No. PCT/JP2012/050119, filed on Jan. 5, 2012, and designating the U.S., the entire contents of which are incorporated herein by reference.

FIELD

The embodiments discussed herein are related to a power generator.

BACKGROUND

Recently, wireless sensor systems in which compact sensors having a sensor function and a wireless function integrated are arranged, and in which the respective wireless sensors are networked are developed. In the wireless sensor system, data detected by the sensor function of each of the wireless sensors is collected by a data center, and the like. Moreover, in the wireless sensor, because the installation environment varies, a power generator is equipped so that the wireless sensor can operate in an environment in which it is difficult to supply power.

Furthermore, in the wireless sensor system, the wireless sensor is mounted on an object such as a motor, engine, and a boiler, for example. An operation state of the object is measured by the sensor function of the wireless sensor, and the result of measurement is collected by the data center through a network.

A power generation method of the power generator installed in the wireless sensor varies according to the installation environment of the wireless sensor, and is, for example, photovoltaic power generation, thermal power generation, vibration power generation, and the like. Furthermore, as a power generator, a power generator that applies more than one power generation method is also known. For example, although it is not a kind to be equipped in the wireless sensors, a power generator that adopts a technique of applying both thermal power generation and vibration power generation in combination has been known as a power generator.

Patent Document 1: Japanese Laid-open Patent Publication No. 2009-240086

Patent Document 2: Japanese Laid-open Patent Publication No. 2001-15823

However, when thermal power generation and vibration power generation are used in combination as a power generation method of a power generator, a thermal generation unit that generates power by thermal conversion and a vibration generation unit that generates power by vibration conversion are set to objects being a heat source and a vibration source, respectively, and therefore, the power generator itself increases in size.

SUMMARY

According to an aspect of the embodiments, a power generator includes a vibration conversion element, a heat conductor and a thermoelectric conversion element. The vibration conversion element is arranged on an object to be a heat source and a vibration source, and generates electric power according to vibration transmitted from the object. The heat conductor is arranged on the object, and conducts heat from the object. The thermoelectric conversion element is arranged so as to be layered on a mounting surface of the vibration conversion element on an opposite side to a mounting surface on a side of the object, and generates electric power according to inner temperature difference between temperature on a heat absorbing side obtained by heat conduction of the heat conductor and temperature on a heat releasing side.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Preferred embodiments of the present invention will be explained with reference to accompanying drawings. The disclosed technique is not limited to the embodiments. Moreover, the respective embodiments may be combined as necessary, without causing inconsistency.

[a] First Embodiment

Figure 1:
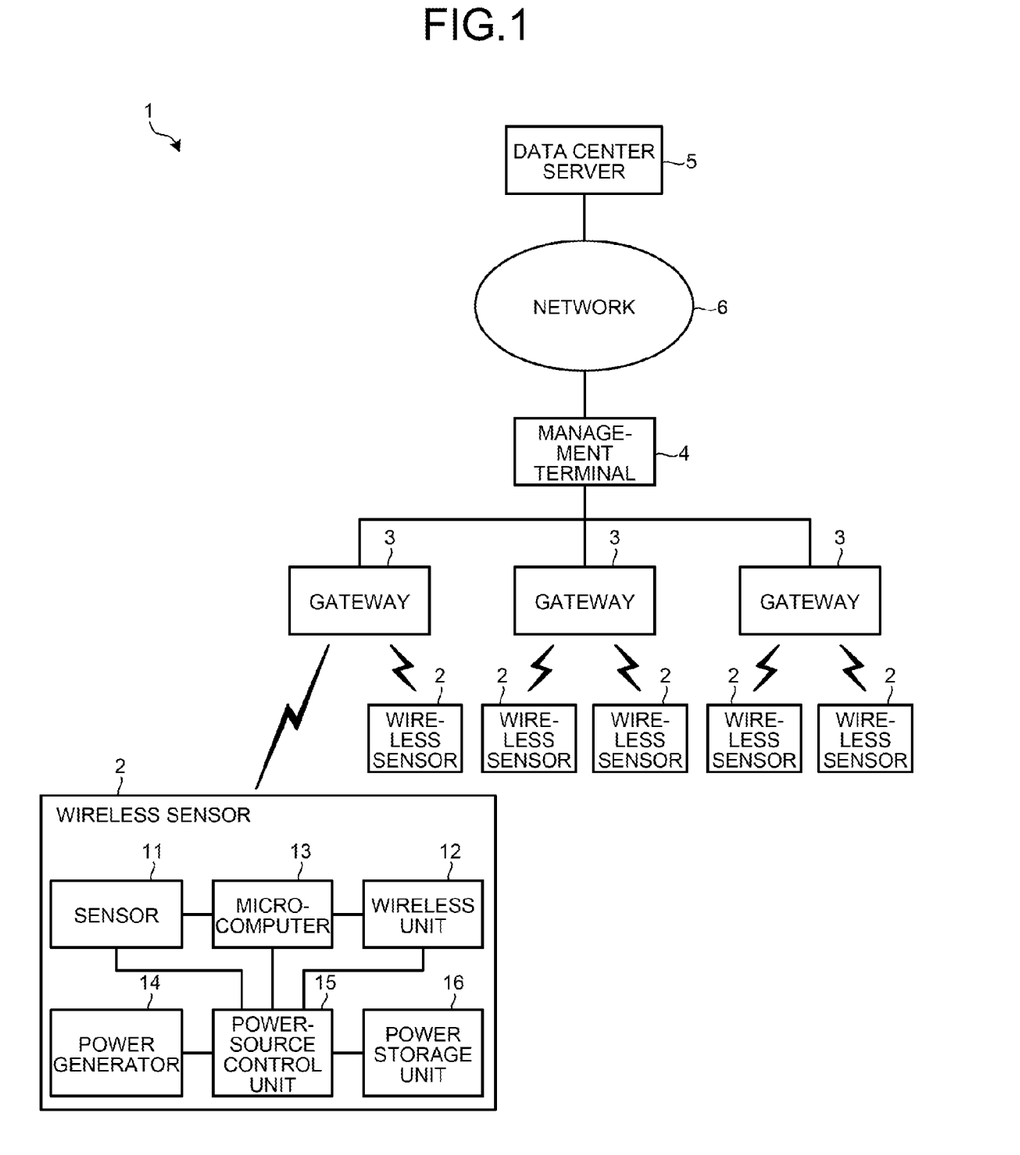
FIG. 1 is an explanatory diagram illustrating an example of a wireless sensor system according to a present embodiment.

FIG. 1 is an explanatory diagram illustrating an example of a wireless sensor system according to a present embodiment. A wireless sensor system 1 shown in FIG. 1 includes wireless sensors 2, gateways 3, a management terminal 4, and a data center server 5. The wireless sensor 2 is mounted on an object such as an engine and a motor, for example, to be a heat source and a vibration source. The wireless sensor 2 is, for example, to measure an operation state of the object. The wireless sensor 2 performs wireless communication with the gateway 3. The gateway 3 wireless-communicates with the wireless sensors 2 arranged in a wireless communication area, and communicates with the management terminal 4.

The management terminal 4 is a terminal device such as a computer, for example, that communicates with the multiple gateways 3 and a network 6, and collects a measurement result of each of the wireless sensors 2 through the gateway 3. The data center server 5 communicates with the management terminal 4 through the network 6, and collects a measurement result of each of the wireless sensors 2.

The wireless sensor 2 includes a sensor 11, a wireless unit 12, a microcomputer 13, a power generator 14, a power-source control unit 15, and a power storage unit 16. The sensor 11 measures an operation state and the like of the object by detecting various kinds of data such as acceleration and temperature, for example, from the object. The wireless unit 12 controls wireless communication with the gateways 3. The microcomputer 13 controls the entire wireless sensors 2. The microcomputer 13 is, for example, to perform signal processing or arithmetic processing on the measurement result detected by the sensor 11.

The power generator 14 is a device that generates electric power using heat power generation and vibration power generation described later. The power-source control unit 15 converts the power generated by the power generator 14 into direct current by a rectifier or boosts the power by a direct current (DC)/DC converter, to stabilize the power at a predetermined level, and store the stabilized power in the power storage unit 16. Furthermore, the power-source control unit 15 supplies the power stored in the power storage unit 16 to the sensors 11, the wireless unit 12, and the microcomputer 13.

Figure 2:
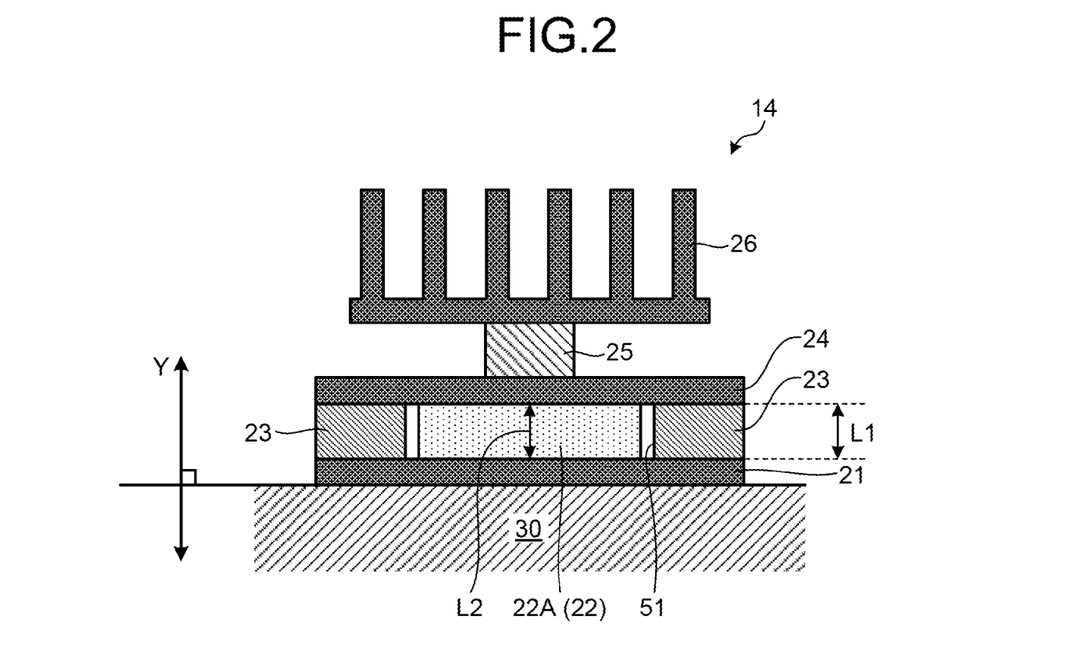
FIG. 2 is a cross-section illustrating an example of a power generator of a first embodiment.
Figure 3:
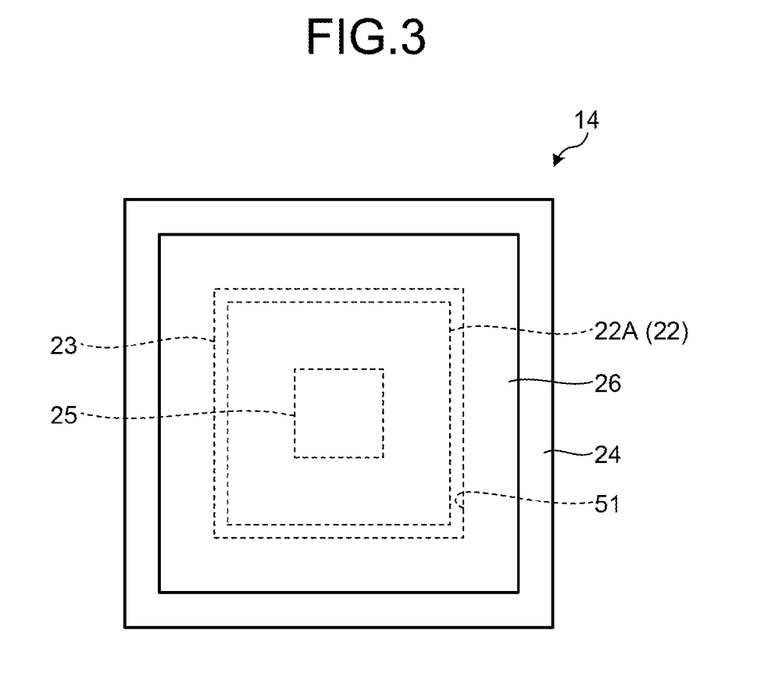
FIG. 3 is a plan view illustrating an example of the power generator of the first embodiment.

Moreover, the power generator 14 generates electric power according to heat and vibration of the object 30 on which the wireless sensor 2 is mounted. FIG. 2 is a cross-section illustrating an example of the power generator 14 of the first embodiment. FIG. 3 is a plan view illustrating an example of the power generator 14 of the first embodiment. The power generator 14 shown in FIG. 2 includes a conductive plate 21, a piezoelectric element 22, a first heat conductor 23, a second heat conductor 24, a thermoelectric element 25, and a heat releasing unit 26. The conductive plate 21 is arranged on a surface of the object 30, and conducts heat generated by the object 30 to the first heat conductor 23, and conducts vibration generated by the object 30 to the piezoelectric element 22.

Figure 4:
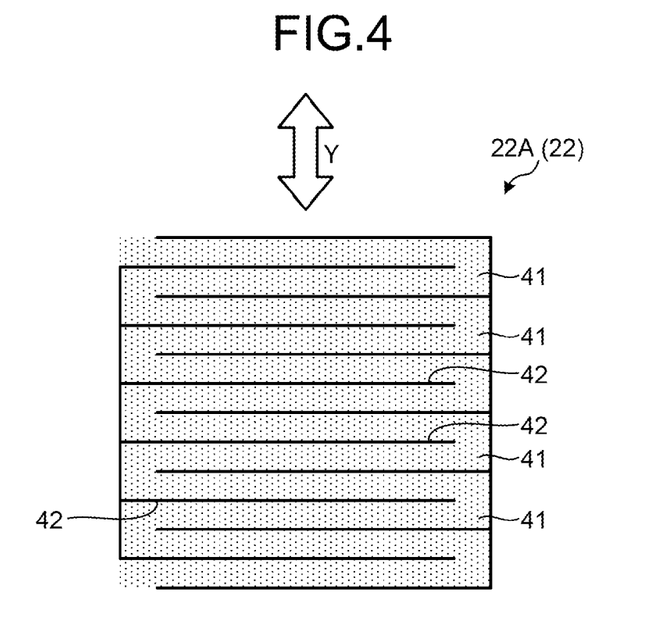
FIG. 4 is an explanatory diagram illustrating an example of a layered-polymer piezoelectric element that is used in the power generator of the first embodiment.

The piezoelectric element 22 is a layered-polymer piezoelectric element 22A that generates electric power according to the conducted vibration. FIG. 4 is an explanatory diagram illustrating an example of the layered-polymer piezoelectric element 22A of the first embodiment. The layered-polymer piezoelectric element 22A shown in FIG. 4 has a layered structure in which polymer piezoelectric-material layers 41 and an electrode layer 42 are layered in multiple layers. For the polymer piezoelectric-material layers 41, for example, a high-polymer material such as polyvinylidene fluoride (PVDF), vinylidene fluoride copolymer, odd-nylon polyamide family, and cyanide vynilidene copolymer is used. Furthermore, for the electrode layer 42, a conductive material such as aluminum (Al), copper (Cu), and nickel (Ni) is used.

The layered-polymer piezoelectric element 22A has low Young's modulus and flexibility because high-polymer piezoelectric material is used. Consequently, the layered-polymer piezoelectric element 22A generates electric power by stretching and contracting in a Y direction according to vibration displacement of the object 30 in the Y direction.

The first heat conductor 23 is formed with thermal conductive flexible material. For the first heat conductor 23, for example, a complex consisting of a thermal conductive material like metal such as Cu and Al, highly thermal conductive ceramic such as silicon carbide (SiC) and aluminum nitride (AlN), or the like and a flexible material such as synthetic resin is used. Moreover, for the first heat conductor 23, a metallic or ceramic fiber aggregate, a metallic spring, or the like may be used. The first heat conductor 23 has a rectangular housing hole 51 that penetrates through from the front to the back at a central part thereof. The first heat conductor 23 is arranged on the conductive plate 21. In the housing hole 51 of the first heat conductor 23, the layered-polymer piezoelectric element 22A is housed. The layered-polymer piezoelectric element 22A is mounted on the conductive plate 21 in so as to be housed in the housing hole 51 of the first heat conductor 23.

The second heat conductor 24 is formed with a thermal conductive material. The second heat conductor 24 is arranged on the first heat conductor 23 and the layered-polymer piezoelectric element 22A so as to close the opening of the housing hole 51 of the first heat conductor 23.

Furthermore, the thermoelectric element 25 is a thermoelectric conversion element, and generates electric power according to temperature difference inside the thermoelectric element 25 between heat from the object 30 and heat from ambient environment. The thermoelectric element 25 is, for example, of π-type in which n-type semiconductors and p-type semiconductors are alternately arranged and wired in series. The thermoelectric element 25 is not limited to π-type and may be of other types. Moreover, a material of the thermoelectric element 25 is selected from, for example, a silicide family such as magnesium silicide (MgSi), an oxide family, a clathrate family, and the like in addition to a heavy metal family such as bithmuth-tellurium (BiT) appropriately according to operating temperature.

Furthermore, the power generation output of the thermoelectric element 25 is Ph, temperature difference between the ambient environment (ambient air) of the thermoelectric element 25 and the object 30 is Tex, and temperature difference in the thermoelectric element 25 is Td. Moreover, thermal resistance of the heat releasing unit 26 is Rout, thermal resistance of the thermoelectric element 25 is Rd, thermal resistance of the thermoelectric element 25 on a heat absorbing side is Rin, thermal electric power of the thermoelectric element 25 is S, and electric resistance of the thermoelectric element 25 is r. The power generation output Ph of the thermoelectric element 25 can be calculated by Ph=1/(4r)×S²Td². Note that Td=Tex×Rd/(Rin+Rd+Rout). The thermoelectric element 25 is arranged at a portion to be layered with the piezoelectric element 22 in the housing hole 51 in the second heat conductor 24.

Furthermore, the heat releasing unit 26 is arranged on a mounting surface on the opposite side of a mounting surface on a side of the second heat conductor 24 of the thermoelectric element 25, and releases heat conducted to the thermoelectric element 25.

Moreover, the thermoelectric element 25 on which the heat releasing unit 26 is mounted and the second heat conductor 24 on which the thermoelectric element 25 is mounted applies pressure to the layered-polymer piezoelectric element 22A toward the object 30 with the weight thereof. Accordingly, even if a weight is not arranged for the layered-polymer piezoelectric element 22A, the heat releasing unit 26 and the thermoelectric element 25 act as a weight of the layered-polymer piezoelectric element 22A.

A resonance frequency of the power generator 14 is set lower than a resonance frequency of the object 30. Furthermore, a resonance frequency of the layered-polymer piezoelectric element 22A is set lower than a resonance frequency of the thermoelectric element 25. Consequently, vibration of the thermoelectric element 25 can be suppressed.

When vibration generated by the object 30 is conducted, the layered-polymer piezoelectric element 22A of the power generator 14 generates electric power according to the vibration. Moreover, to the thermoelectric element 25 of the power generator 14, heat generated by the object 30 is conducted through the conductive plate 21, the first heat conductor 23, and the second heat conductor 24. To the thermoelectric element 25, heat generated by the object 30 is also conducted through the layered-polymer piezoelectric element 22A and the second heat conductor 24. The thermoelectric element 25 generates electric power according to temperature difference thereinside between the conducted heat and heat from the ambient environment.

Heat resistance of the thermoelectric element 25 on a heat receiving side by contact with metal is small compared to heat resistance on a heat releasing side by heat conduction from the ambient environment. Therefore, when the piezoelectric element 22 and the first heat conductor 23 are arranged between the object 30 and the thermoelectric element 25, reduction in heat conduction to the thermoelectric element 25 caused as a result of insertion of the piezoelectric element 22 and the first heat conductor 23 causes reduction in power generation amount of the thermoelectric element 25.

Figure 5:
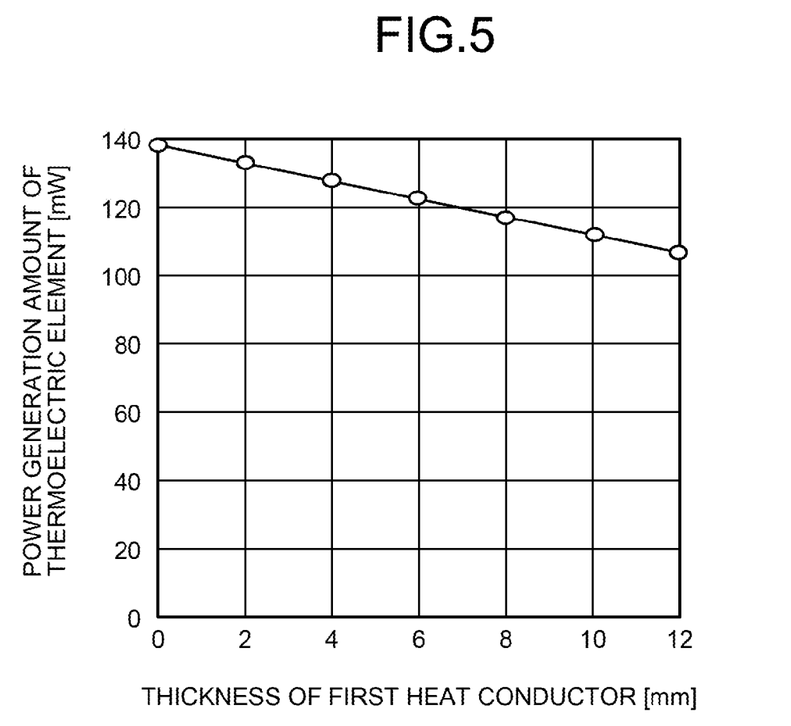
FIG. 5 is an explanatory diagram illustrating an example of relation between a power generation amount of a thermoelectric element and thickness of a first heat conductor (Cu metallic wool) used in the power generator of the first embodiment.

FIG. 5 is an explanatory diagram illustrating an example of relation between thickness of the first heat conductor 23 (Cu metallic wool) and a power generation amount of the thermoelectric element 25 used in the power generator 14 of the first embodiment. Suppose, for example, the thermoelectric element 25 is quadrate (15 mm*15 mm), the heat releasing unit 26 is quadrate (50 mm*50 mm), the first heat conductor 23 of Cu metallic wool is quadrate (50 mm*50 mm), and the housing hole 51 is quadrate (25 mm*25 mm). The thickness of the first heat conductor 23 is a distance L1 between a mounting surface to the second heat conductor 24 and a mounting surface to the conductive plate 21. As shown in FIG. 5, for example, even when the thickness L1 of the first heat conductor 23 is 10 mm, reduction in the power generation amount of the thermoelectric element 25 is 20% or lower compared to a case in which the thickness L1 of the first heat conductor 23 is 0 mm. As a result, when thickness L2 of the piezoelectric element 22 housed in the housing hole 51 of the first heat conductor 23 is 10 mm or thinner, reduction in the power generation amount of the thermoelectric element 25 is 20% or lower.

Figure 6:
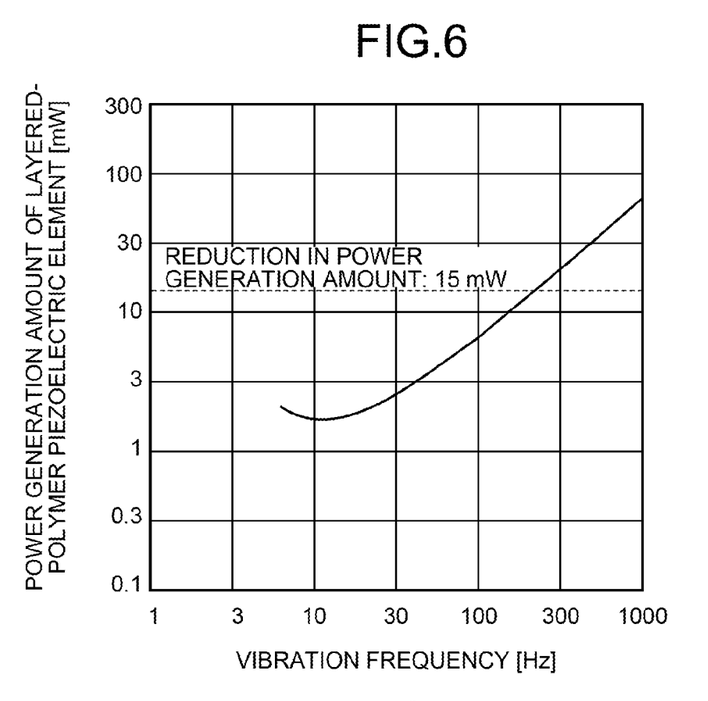
FIG. 6 is an explanatory diagram illustrating an example of relation between a power generation amount of the layered-polymer piezoelectric element used in the power generator of the first embodiment and a vibration frequency of an object.

FIG. 6 is an explanatory diagram illustrating an example of relation between a power generation amount of the layered-polymer piezoelectric element 22A used in the power generator 14 of the first embodiment and a vibration frequency of the object 30. The layered-polymer piezoelectric element 22A has, for example, PVDF as the polymer piezoelectric-material layers 41, Al as the electrode layer 42, and a size of 25 mm*25 mm with thickness L2 of 5 mm. In this case, referring to FIG. 5, when the layered-polymer piezoelectric element 22A has the thickness L2 of 5 mm, reduction in the power generation amount of the thermoelectric element 25 is, for example, 15 milliwatts (mW). Therefore, as shown in FIG. 6, when the reduction in the power generation amount is 15 mW, if the vibration frequency of the object 30 is, for example, 300 Hertz (Hz) or higher, a power generation amount more than 15 mW can be acquired at the piezoelectric element 22.

Figure 7:
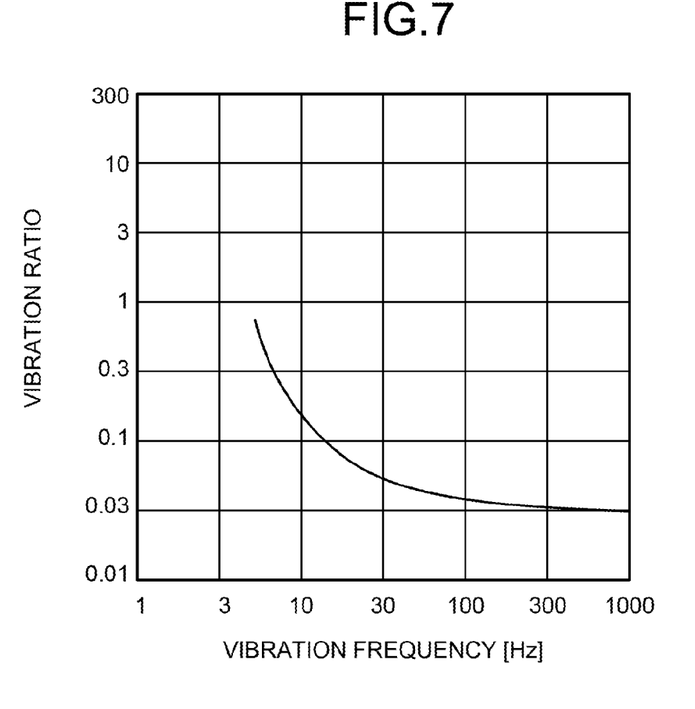
FIG. 7 is an explanatory diagram illustrating an example of relation between a vibration ratio of the power generator of the first embodiment and a vibration frequency of the object.

Moreover, as described previously, the power generator 14 can suppress vibration to the thermoelectric element 25 by setting the resonance frequency lower than the resonance frequency of the object 30, and by setting the resonance frequency of the layered-polymer piezoelectric element 22A lower than the resonance frequency of the thermoelectric element 25. FIG. 7 is an explanatory diagram illustrating an example of relation between a vibration ratio of the power generator 14 of the first embodiment and a vibration frequency of the object 30. The vibration ratio is a ratio of vibration of the thermoelectric element 25 to vibration of the object 30. Because the resonance frequency of the layered-polymer piezoelectric element 22A is set to 10 Hz, as shown in FIG. 7, when the vibration frequency of the object 30 is 100 Hz or higher, vibration of the thermoelectric element 25 is 1/10 of vibration of the object 30 or lower, and the vibration control effect is high.

In the first embodiment, because of the structure that the thermoelectric element 25 is layered on the layered-polymer piezoelectric element 22A, an installation space can be reduced compared to a case in which the layered-polymer piezoelectric element 22A and the thermoelectric element 25 are arranged individually on the object 30. As a result, as well as miniaturization of the power generator 14, miniaturization of the wireless sensor 2 equipped with the power generator 14 can be achieved.

In the first embodiment, because the thermoelectric element 25 and the heat releasing unit 26 act as a weight of the layered-polymer piezoelectric element 22A, it is not required to arrange a weight for the layered-polymer piezoelectric element 22A. Therefore, weight and volume of the power generator 14 can be reduced compared to a case in which the layered-polymer piezoelectric element 22A and the thermoelectric element 25 are arranged separately. As a result, as well as miniaturization of the power generator 14, miniaturization of the wireless sensor 2 equipped with the power generator 14 can be achieved.

In the first embodiment, the resonance frequency of the power generator 14 is set lower than the resonance frequency of the object 30. Furthermore, the resonance frequency of the layered-polymer piezoelectric element 22A is set lower than the resonance frequency of the thermoelectric element 25. Therefore, vibration from the object 30 to the thermoelectric element 25 is absorbed by the layered-polymer piezoelectric element 22A, and thus vibration to the thermoelectric element 25 can be suppressed. As a result, credibility of the thermoelectric element 25 can be secured.

In the first embodiment, because the layered-polymer piezoelectric element 22A is arranged between the object 30 and the thermoelectric element 25, flow of heat from the object 30 to the thermoelectric element 25 decreases, and a released amount to atmosphere through the heat releasing unit 26 from the thermoelectric element 25 is also limited. As a result, reduction in the power generation amount of the thermoelectric element 25 by insertion of the layered-polymer piezoelectric element 22A between the object 30 and the thermoelectric element 25 can be suppressed.

Although in the first embodiment described above, the thickness L1 of the first heat conductor 23 is set to be thicker than the thickness L2 of the layered-polymer piezoelectric element 22A that is housed in the housing hole 51, the thickness L1 of the first heat conductor 23 may be set to be thinner than the thickness L2 of the layered-polymer piezoelectric element 22A. An embodiment in such a case is explained below as a second embodiment.

[b] Second Embodiment

Figure 8:
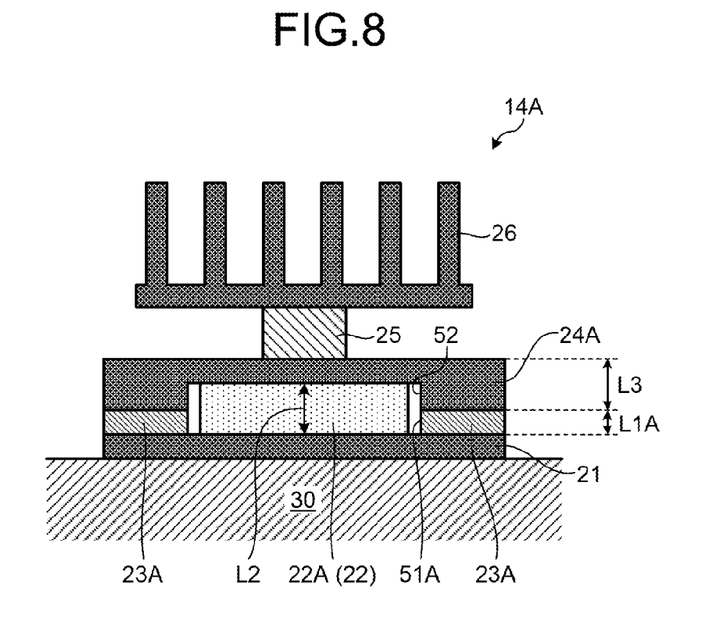
FIG. 8 is a cross-section illustrating an example of a power generator of a second embodiment.

FIG. 8 is a cross-section illustrating an example of a power generator of a second embodiment. By giving the same reference symbols to the same components as those of the power generator 14 of the first embodiment, explanation of the duplicated components and operations is omitted. Thickness L1A of a first heat conductor 23A of a power generator 14A shown in FIG. 8 is thinner than thickness L2 of the layered-polymer piezoelectric element 22A. Thickness L3 of a second heat conductor 24A is thick compared to thickness of the second heat conductor 24 of the first embodiment. Furthermore, the second heat conductor 24A has a housing hole 52 on a mounting surface side that opposes to the first heat conductor 23A and the layered-polymer piezoelectric element 22A.

The second heat conductor 24A is arranged on the first heat conductor 23A, and an upper portion the layered-polymer piezoelectric element 22A arranged in a housing hole 51A of the first heat conductor 23A is housed in the housing hole 52. Consequently, the thickness L1A of the first heat conductor 23A is to be thin compared to the thickness L1 of the first heat conductor 23A of the first embodiment, and therefore, an amount of heat conducted to the thermoelectric element 25 through the first heat conductor 23A increases. As a result, the power generation amount of the first thermoelectric element 25 also increases.

Figure 9:
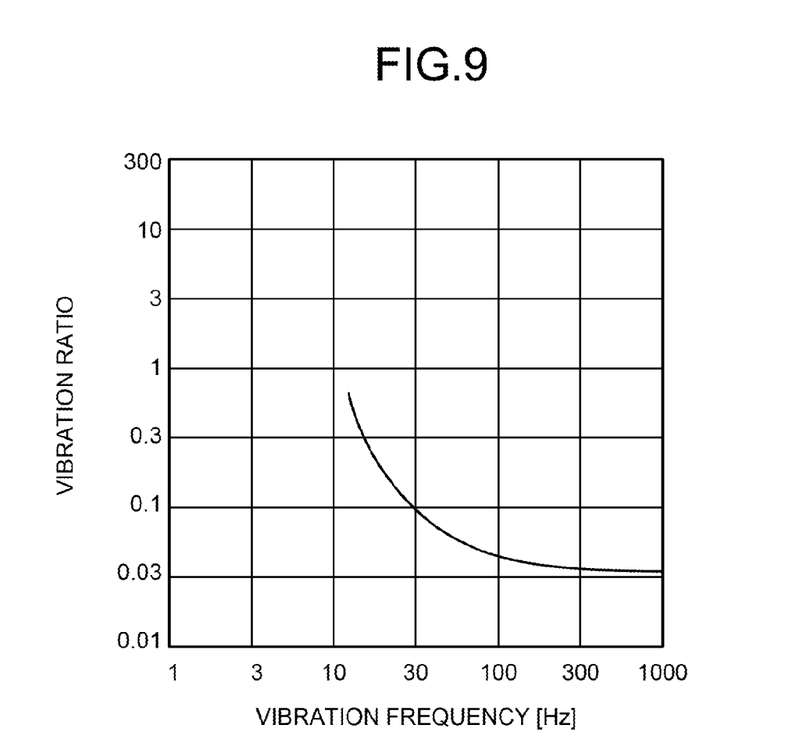
FIG. 9 is an explanatory diagram illustrating an example of relation between a vibration ratio of the power generator of the second embodiment and a vibration frequency of the object.

Furthermore, because the thickness L1A of the first heat conductor 23A is thin compared to the thickness L1 of the first heat conductor 23A of the first embodiment, the resonance frequency of the power generator 14A increases. As a result, vibration control is secured for the thermoelectric element 25. FIG. 9 is an explanatory diagram illustrating an example of relation between a vibration ratio used in the power generator 14A of the second embodiment and a vibration frequency of the object 30. The vibration ratio is a ratio of vibration of the thermoelectric element 25 to vibration of the object 30. Because the resonance frequency of the layered-polymer piezoelectric element 22A is set to 10 Hz, as show in FIG. 9, when the vibration frequency of the object 30 is 100 Hz or higher, vibration of the thermoelectric element 25 is 1/10 of vibration of the object 30 or lower, and the vibration control effect is high.

In the second embodiment, because the thickness L3 of the second heat conductor 24 is made thick and the thickness L1 of the first heat conductor 23A is made thin, an amount of heat conducted to the thermoelectric element 25 from the object 30 increases, and therefore, the power generation amount of the thermoelectric element 25 also increases.

Moreover, although in the first embodiment described above, the layered-polymer piezoelectric element 22A is adopted as the piezoelectric element 22, for example a moonie piezoelectric element may be adopted. An embodiment of this case is explained as a third embodiment below.

[C] Third Embodiment

Figure 10:
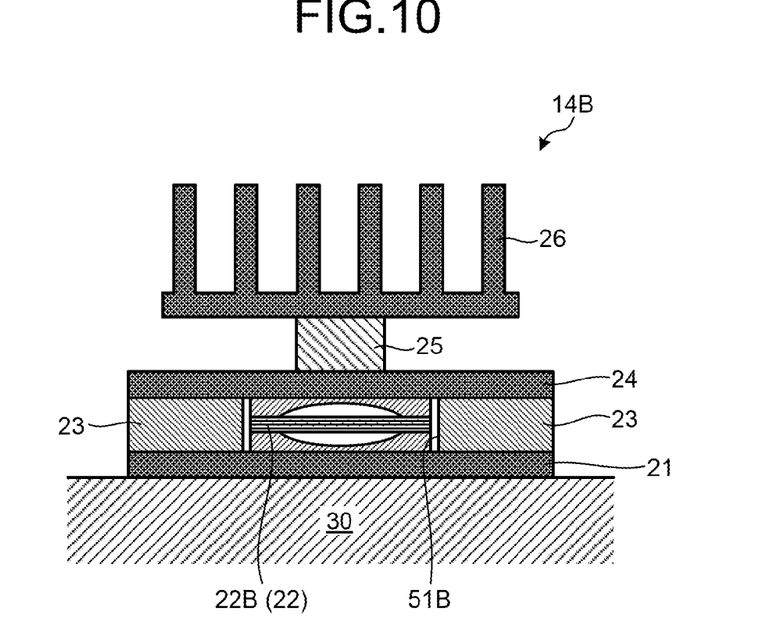
FIG. 10 is a cross-section illustrating an example of a power generator of a third embodiment.
Figure 11:
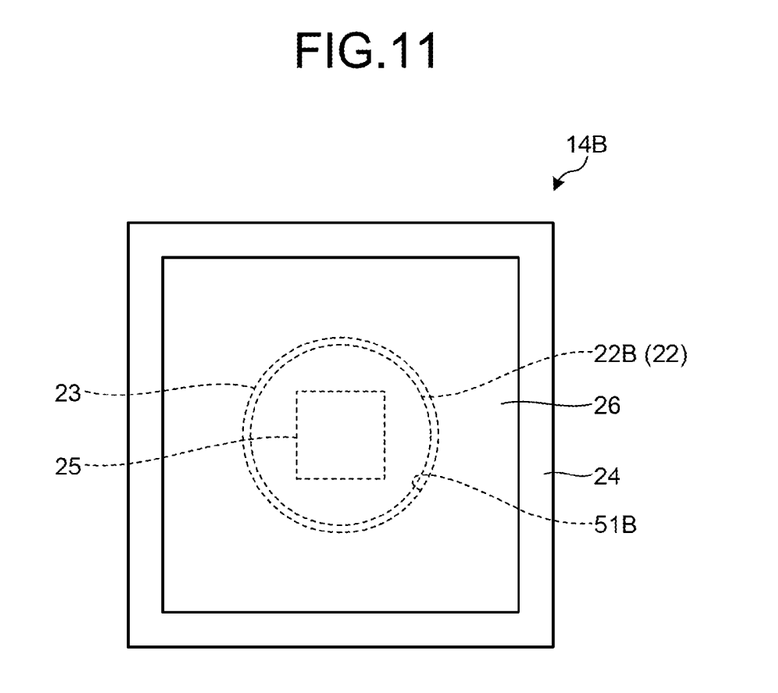
FIG. 11 is a plan view illustrating an example of the power generator of the third embodiment.
Figure 12:
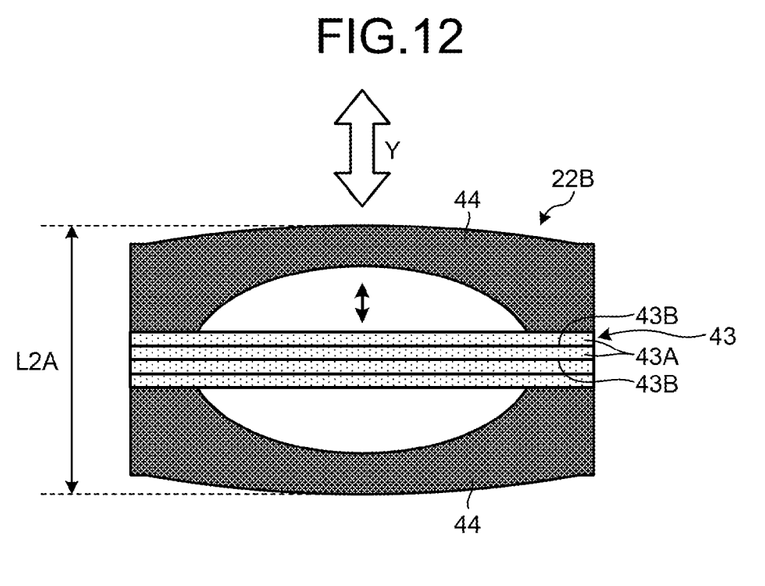
FIG. 12 is an explanatory diagram illustrating an example of a moonie piezoelectric element used in the power generator of the third embodiment.

FIG. 10 is a cross-section illustrating an example of a power generator of the third embodiment. By giving the same reference symbols to the same components as those of the power generator 14 of the first embodiment, explanation of the duplicated components and operations is omitted. FIG. 11 is a plan view illustrating an example of power generator 14B of the third embodiment. FIG. 12 is an explanatory diagram illustrating an example of a moonie piezoelectric element 22B used in the power generator 14B of the third embodiment.

The first heat conductor 23 in the power generator 14B shown in FIG. 10 and FIG. 11 has a circular housing hole 51B that penetrates through from the front to the back at a central part thereof. Furthermore, the piezoelectric element 22 housed in the housing hole 51B is the moonie piezoelectric element 22B. The moonie piezoelectric element 22B shown in FIG. 12 includes a layered-piezoelectric ceramic element 43 and a domical metallic part 44, and has such a structure that the layered-piezoelectric ceramic element 43 is sandwiched on the front and back by the domical metallic part 44. The layered-piezoelectric ceramic element 43 has such a structure that piezoelectric ceramic layers 43A and electrode layers 43B are layered. The moonie piezoelectric element 22B reduces displacement by stress in the Y direction and converts into displacement of the layered-piezoelectric ceramic element 43 in a horizontal direction. Consequently, by converting into displacement of the layered-piezoelectric ceramic element 43 in the horizontal direction, a large power generation amount is obtained by large stress to the layered-piezoelectric ceramic element 43. The moonie piezoelectric element 22B generates electric power according to stress caused by vibration of the object 30.

Figure 13:
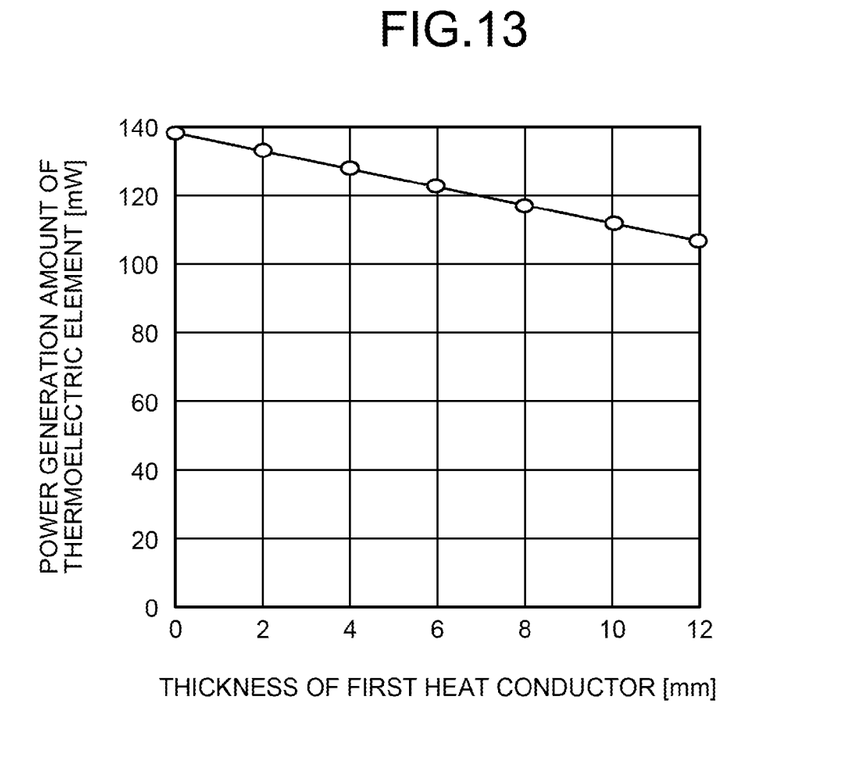
FIG. 13 is an explanatory diagram illustrating an example of relation between a power generation amount of a thermoelectric element and thickness of the first heat conductor (Cu metallic wool) used in the power generator of the third embodiment.

FIG. 13 is an explanatory diagram illustrating an example of relation between thickness of the first heat conductor 23 (Cu metallic wool) and a power generation amount of the thermoelectric element 25 used in the power generator 14B of the third embodiment. Suppose, for example, the thermoelectric element 25 is quadrate (15 mm*15 mm), the heat releasing unit 26 is quadrate (50 mm*50 mm), the first heat conductor 23 of Cu metallic wool is quadrate (50 mm*50 mm), and the housing hole 51B is 30 mm in diameter. As shown in FIG. 13, for example, even when the thickness L1 of the first heat conductor 23 is 10 mm, reduction in the power generation amount of the thermoelectric element 25 is 20% or lower compared to a case of the thickness L1 of the first heat conductor 23 being 0 mm. Consequently, when a thickness L2A of the moonie piezoelectric element 22B that is housed in the housing hole 51B of the first heat conductor 23 is 10 mm or thinner, reduction in the power generation amount of the thermoelectric element 25 is 20% or lower.

Figure 14:
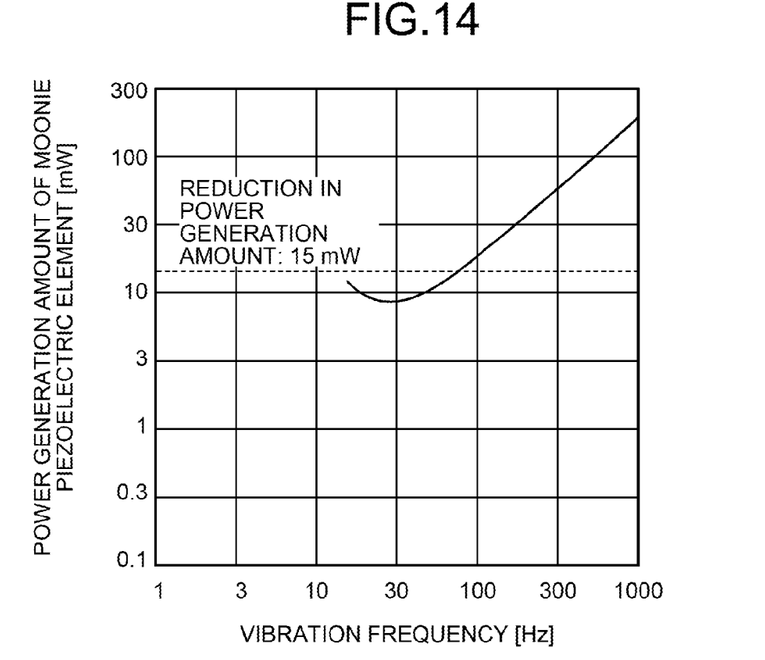
FIG. 14 is an explanatory diagram illustrating an example of relation between a power generation amount of the moonie piezoelectric element used in the power generator of the third embodiment and a vibration frequency.

FIG. 14 is an explanatory diagram illustrating an example of relation between a power generation amount of the moonie piezoelectric element 22B used in the power generator 14B of the third embodiment and a vibration frequency of the object 30. For the moonie piezoelectric element 22B, for example, a multi-layered piezoelectric-ceramic element 43 in which the piezoelectric ceramic layers 43A of a lead zirconate titanateand (PZT) family that is 30 mm in diameter and 1 mm in thickness and the electrode layers 43B are layered is used. Furthermore, the moonie piezoelectric element 22B uses the domical metallic part 44 that is 30 mm in diameter and 2 mm in thickness formed with metal of Be—Cu family. In this case, referring FIG. 13, with the moonie piezoelectric element 22B having thickness of 5 mm, reduction in the power generation amount of the thermoelectric element 25 is, for example, 15 mW. Therefore, as shown in FIG. 14, when the reduction in the power generation amount of the thermoelectric element 25 is 15 mW or less, if the vibration frequency of the object 30 is, for example, 100 Hz or higher, the power generation amount more than 15 mW can be obtained with the moonie piezoelectric element 22B.

Figure 15:
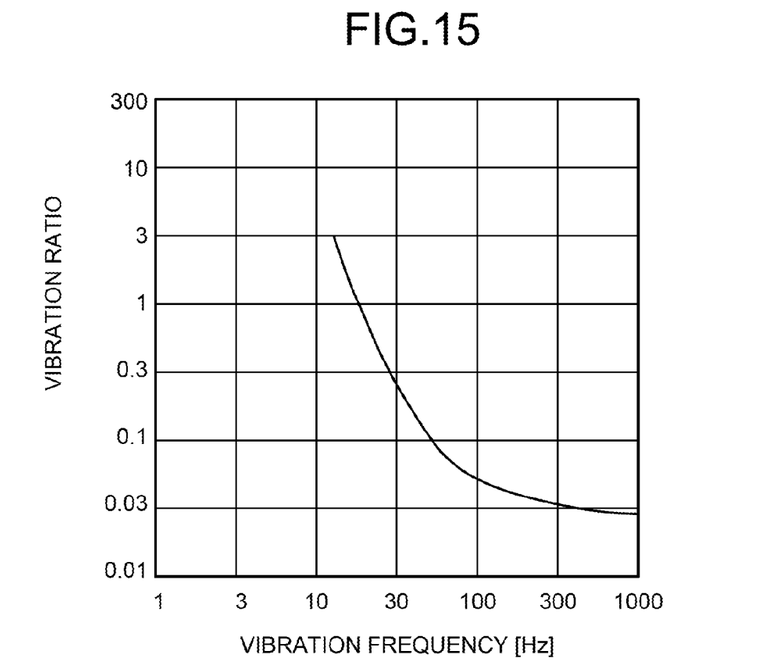
FIG. 15 is an explanatory diagram illustrating an example of relation between a vibration ratio of the power generator of the third embodiment and a vibration frequency of an object.

Furthermore, as described above, the resonance frequency of the power generator 14B is set lower than the resonance frequency of the object 30, and the resonance frequency of the moonie piezoelectric element 22B is set lower than the resonance frequency of the thermoelectric element 25, thereby suppressing vibration to the thermoelectric element 25. FIG. 15 is an explanatory diagram of relation between a vibration ratio of the power generator 14B of the third embodiment and a vibration frequency of the object 30. The vibration ratio is a ratio of vibration of the thermoelectric element 25 to vibration of the object 30. Because the resonance frequency of the moonie piezoelectric element 22B is set to 10 Hz, as shown in FIG. 15, when the vibration frequency of the object 30 is 100 Hz or higher, vibration of the thermoelectric element 25 is 1/10 of vibration of the object 30 or lower, and the vibration control effect is high.

In the third embodiment, because of the structure that the thermoelectric element 25 is layered on the moonie piezoelectric element 22B, an installation space on the object 30 can be reduced. As a result, as well as miniaturization of the power generator 14B, miniaturization of the wireless sensor 2 equipped with the power generator 14B can be achieved.

In the third embodiment, because the thermoelectric element 25 and the heat releasing unit 26 act as a weight of the moonie piezoelectric element 22B, it is not required to arrange a weight for the moonie piezoelectric element 22B. Therefore, weight and volume of the power generator 14B can be reduced. As a result, as well as miniaturization of the power generator 14B, miniaturization of the wireless sensor 2 equipped with the power generator 14B can be achieved.

In the third embodiment, the resonance frequency of the power generator 14B is set lower than the resonance frequency of the object 30. Furthermore, the resonance frequency of the moonie piezoelectric element 22B is set lower than the resonance frequency of the thermoelectric element 25. Therefore, vibration from the object 30 to the thermoelectric element 25 is absorbed by the moonie piezoelectric element 22B, and thus vibration to the thermoelectric element 25 can be suppressed. As a result, credibility of the thermoelectric element 25 can be secured.

In the third embodiment, because the moonie piezoelectric element 22B is arranged between the object 30 and the thermoelectric element 25, flow of heat from the object 30 to the thermoelectric element 25 decreases, and a released amount to atmosphere through the heat releasing unit 26 from the thermoelectric element 25 is also limited. As a result, reduction in the power generation amount of the thermoelectric element 25 caused by insertion of the moonie piezoelectric element 22B between the object 30 and the thermoelectric element 25 can be suppressed.

Moreover, although in the first embodiment described above, the layered-polymer piezoelectric element 22A is adopted as the piezoelectric element 22, and for example a cymbal piezoelectric element may also be adopted. An embodiment of this case is explained as a fourth embodiment below.

[d] Fourth Embodiment

Figure 16:
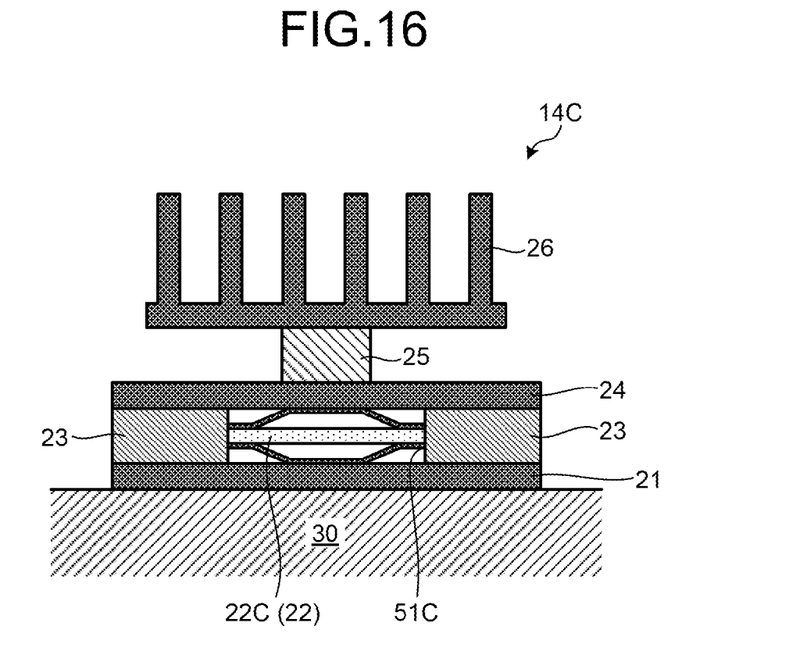
FIG. 16 is a cross-section illustrating an example of a power generator of a fourth embodiment.
Figure 17:
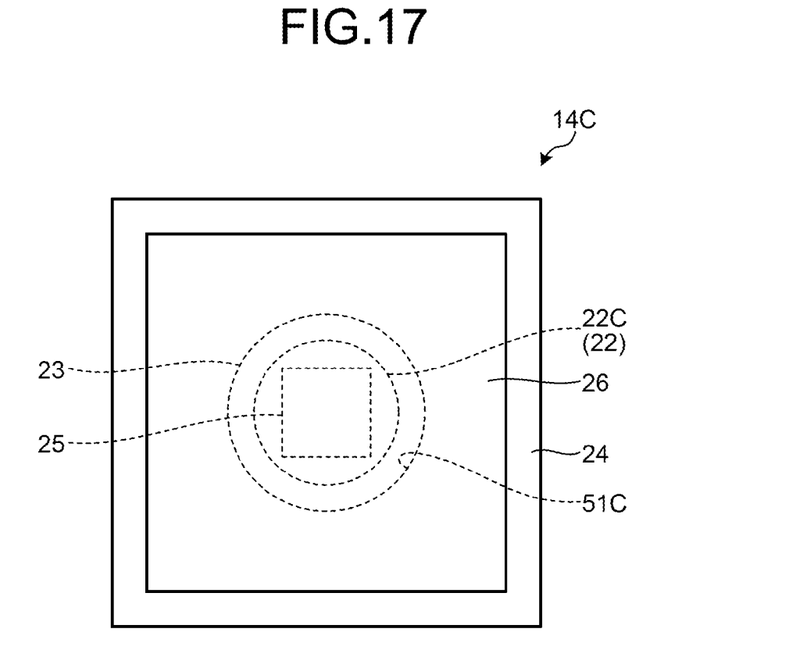
FIG. 17 is a plan view illustrating an example of the power generator of the fourth embodiment.
Figure 18:
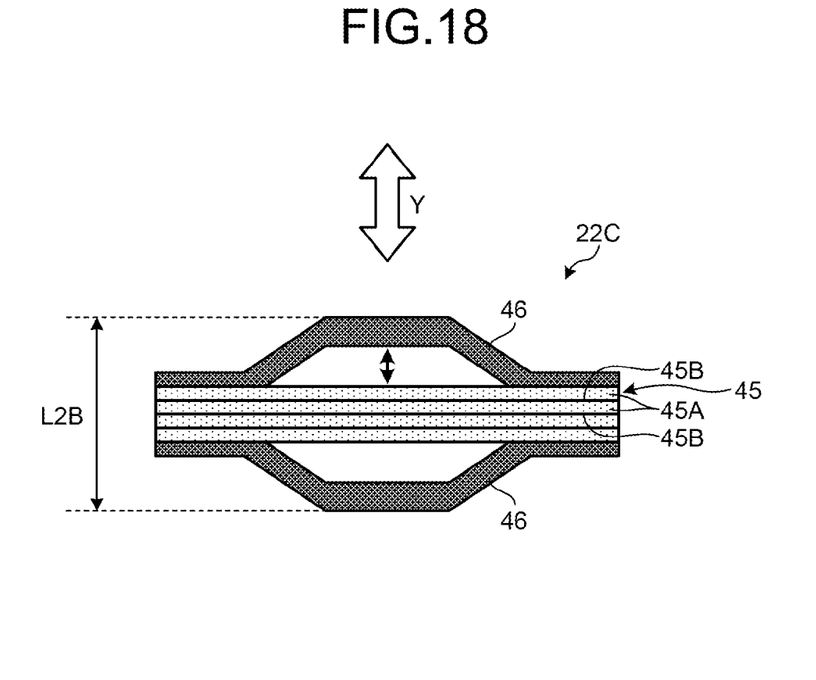
FIG. 18 is an explanatory diagram illustrating an example of a cymbal piezoelectric element used in the power generator of the fourth embodiment.

FIG. 16 is a cross-section illustrating an example of a power generator of the fourth embodiment. By giving the same reference symbols to the same components as those of the power generator 14 of the first embodiment, explanation of the duplicated components and operations is omitted. FIG. 17 is a plan view illustrating an example of a power generator 14C of the fourth embodiment. FIG. 18 is an explanatory diagram illustrating an example of a cymbal piezoelectric element 22C used in the power generator 14C of the fourth embodiment.

The first heat conductor 23 in the power generator 14C shown in FIG. 16 and FIG. 17 has a circular housing hole 51C that penetrates through from the front to the back at a central part thereof. Furthermore, the piezoelectric element 22 housed in the housing hole 51C is the cymbal piezoelectric element 22C. The cymbal piezoelectric element 22C shown in FIG. 18 includes a layered-piezoelectric ceramic element 45 and a cymbal-shaped metallic part 46, and has such a structure that the layered-piezoelectric ceramic element 45 is sandwiched on the front and back by the cymbal-shaped metallic part 46. The layered-piezoelectric ceramic element 45 has such a structure that piezoelectric ceramic layers 45A and electrode layers 45B are layered. The cymbal piezoelectric element 22C reduces displacement by stress in the Y direction and converts into displacement of the layered-piezoelectric ceramic element 45 in a horizontal direction. Consequently, by converting into displacement of the layered-piezoelectric ceramic element 45 in the horizontal direction, a large power generation amount is obtained by large stress to the layered-piezoelectric ceramic element 45. The cymbal piezoelectric element 22C generates electric power according to stress caused by vibration of the object 30.

Furthermore, as described above, the resonance frequency of the power generator 14C is set lower than the resonance frequency of the object 30, and the resonance frequency of the cymbal piezoelectric element 22C is set lower than the resonance frequency of the thermoelectric element 25, thereby suppressing vibration of the thermoelectric element 25.

In the fourth embodiment, because of the structure that the thermoelectric element 25 is layered on the cymbal piezoelectric element 22C, an installation space can be reduced. As a result, as well as miniaturization of the power generator 14C, miniaturization of the wireless sensor 2 equipped with the power generator 14C can be achieved.

In the fourth embodiment, because the thermoelectric element 25 and the heat releasing unit 26 act as a weight of the cymbal piezoelectric element 22C, it is not required to arrange a weight for the cymbal piezoelectric element 22C. Therefore, weight and volume of the power generator 14C can be reduced. As a result, as well as miniaturization of the power generator 14C, miniaturization of the wireless sensor 2 equipped with the power generator 14C can be achieved.

In the fourth embodiment, the resonance frequency of the power generator 14C is set lower than the resonance frequency of the object 30. Furthermore, the resonance frequency of the cymbal piezoelectric element 22C is set lower than the resonance frequency of the thermoelectric element 25. Therefore, propagation of vibration from the object 30 to the thermoelectric element 25 is absorbed by the cymbal piezoelectric element 22C, and thus propagation of vibration to the thermoelectric element 25 can be suppressed. As a result, credibility of the thermoelectric element 25 can be secured.

In the fourth embodiment, because the cymbal piezoelectric element 22C is arranged between the object 30 and the thermoelectric element 25, flow of heat from the object 30 to the thermoelectric element 25 decreases, and a released amount to atmosphere through the heat releasing unit 26 from the thermoelectric element 25 is also limited. As a result, reduction in the power generation amount of the thermoelectric element 25 by insertion of the cymbal piezoelectric element 22C between the object 30 and the thermoelectric element 25 can be suppressed.

Moreover, in the embodiments described above, explanation has been given with the wireless sensor 2 equipped with the power generator 14 (14A, 14B, 14C) as an example, it is not limited to wireless sensors, and is applicable to a device that is equipped with a power generator autonomously generating electric power according to vibration and heat of the object 30.

Disclosed embodiments provide a compact power generator that can apply thermal power generation and vibration power generation in combination.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A power generator comprising:
    a vibration conversion element that is arranged on an object to be a heat source and a vibration source, and that generates electric power according to vibration transmitted from the object;
    a heat conductor that is arranged on the object, and that conducts heat from the object; and
    a thermoelectric conversion element that is arranged so as to be layered on a mounting surface of the vibration conversion element on an opposite side to a mounting surface on a side of the object, and that generates electric power according to inner temperature difference between temperature on a heat absorbing side obtained by heat conduction of the heat conductor and temperature on a heat releasing side.

2. The power generator according to claim 1, wherein the heat conductor includes
    a first heat conductor that is arranged on the object, and that includes a flexible part that conducts heat from the object; and
    a second heat conductor that is arranged on a mounting surface of the first heat conductor on an opposite side to a mounting surface on a side of the object, and is arranged between the vibration conversion element and the thermoelectric conversion element, and that conducts heat from the first heat conductor to the thermoelectric conversion element.

3. The power generator according to claim 1, wherein a resonance frequency of the power generator is set lower than a vibration frequency of the object.

4. The power generator according to claim 3, wherein a resonance frequency of the vibration conversion element is set lower than a resonance frequency of the thermoelectric conversion element.

5. The power generator according to claim 1, further comprising
    a heat releasing unit that is arranged on a mounting surface of the thermoelectric conversion element on an opposite side to a mounting surface on a side of the vibration conversion element, and that releases heat of the thermoelectric conversion element and applies pressure to the vibration conversion element toward a side of the object through the thermoelectric conversion element.

6. The power generator according to claim 1, wherein the vibration conversion element is a layered piezoelectric element that uses a polymer piezoelectric material.

7. The power generator according to claim 1, wherein the vibration conversion element is any one of a moonie piezoelectric element and a cymbal piezoelectric element.

8. The power generator according to claim 1, wherein the thermoelectric element has a structure that n-type semiconductors and p-type semiconductors are alternately arranged and connected in series.

9. The power generator according to claim 2, wherein the first heat conductor is any one of
    a complex of a conductive material and a flexible material, the conductive material being any one of metal and ceramic, the flexible material being synthetic resin;
    an aggregate of any one of metallic fibers and ceramic fibers; and
    a metallic spring.

* * * * *